United States Patent
Zhou et al.

(10) Patent No.: US 10,961,124 B2
(45) Date of Patent: Mar. 30, 2021

(54) METHOD FOR CONTINUOUSLY PREPARING GRAPHENE HEAT-CONDUCTING FILMS

(71) Applicant: Changzhou Fuxi Technology Co., LTD., Jiangsu (CN)

(72) Inventors: Bucun Zhou, Jiangsu (CN); Renjie Zhou, Jiangsu (CN); Feng Li, Jiangsu (CN); Jing Lu, Jiangsu (CN)

(73) Assignee: Changzhou Fuxi Technology Co., LTD., Jiangsu (CN)

( * ) Notice: Subject to any disclaimer, the term of this patent is extended or adjusted under 35 U.S.C. 154(b) by 283 days.

(21) Appl. No.: 16/146,338

(22) Filed: Sep. 28, 2018

(65) Prior Publication Data

US 2019/0031513 A1    Jan. 31, 2019

Related U.S. Application Data

(63) Continuation-in-part of application No. PCT/CN2017/091791, filed on Jul. 5, 2017.

(30) Foreign Application Priority Data

Jan. 23, 2017  (CN) .......................... 201710057914.5

(51) Int. Cl.
  *C01B 32/184* (2017.01)
  *C04B 35/626* (2006.01)
  *C01B 32/192* (2017.01)
  *C04B 35/52* (2006.01)
  *C09K 5/14* (2006.01)
  *F28F 21/02* (2006.01)
  *H05K 9/00* (2006.01)

(52) U.S. Cl.
  CPC .......... *C01B 32/184* (2017.08); *C01B 32/192* (2017.08); *C04B 35/522* (2013.01); *C04B 35/6263* (2013.01); *C04B 35/6264* (2013.01); *C04B 35/62635* (2013.01); *C04B 35/62675* (2013.01); *C09K 5/14* (2013.01); *F28F 21/02* (2013.01); *H05K 9/0081* (2013.01); *C01B 2204/04* (2013.01); *C01B 2204/22* (2013.01); *C01B 2204/24* (2013.01); *C01B 2204/26* (2013.01); *C01P 2004/60* (2013.01); *C01P 2006/10* (2013.01); *C04B 2235/5427* (2013.01); *C04B 2235/604* (2013.01); *C04B 2235/6021* (2013.01); *C04B 2235/6025* (2013.01); *C04B 2235/652* (2013.01); *C04B 2235/6562* (2013.01); *C04B 2235/77* (2013.01); *C04B 2235/96* (2013.01); *C04B 2235/9607* (2013.01)

(58) Field of Classification Search
  None
  See application file for complete search history.

(56) References Cited

U.S. PATENT DOCUMENTS

2015/0337105 A1* 11/2015 Takahashi ............... B32B 27/20
                                                              428/213
2016/0079001 A1*  3/2016 Lin ..................... C04B 35/4682
                                                              361/305

FOREIGN PATENT DOCUMENTS

| CN | 101513998 A |   | 8/2009  |
| CN | 102757038 A | * | 10/2012 |
| CN | 103449423 A | * | 12/2013 |
| CN | 105084858 A |   | 11/2015 |
| CN | 105110794 A | * | 12/2015 |
| CN | 105860939 A |   | 8/2016  |
| JP | 2011-195363 A |   | 10/2011 |

OTHER PUBLICATIONS

Guoqing Xin et al., "Large-Area Freestanding Graphene Paper for Superior Thermal Management," Advanced Materials, May 2014, vol. 26, No. 26, pp. 4521-4526.

* cited by examiner

*Primary Examiner* — Matthew J Daniels
*Assistant Examiner* — Mohammad M Ameen
(74) *Attorney, Agent, or Firm* — Novick, Kim & Lee, PLLC; Allen Xue

(57) ABSTRACT

The present disclosure relates to graphene. In particular, the present disclosure relates to a method for continuously preparing thermally conductive graphene films. A graphite oxide containing 40-60 wt % of moisture is directly stripped at a high temperature; and then, procedures such as dispersion, defoaming, coating, stripping, trimming, and reduction are performed to prepare thermally conductive graphene films with high thermal conductivity coefficient and strong electromagnetic shielding effectiveness. In the method, because of directly stripping the graphite oxide containing 40-60 wt % of moisture at a high temperature, the procedure of drying the graphite oxide is omitted, achieving low energy consumption and low manufacturing costs. Compared with preparing slurry by directly dispersing the graphite oxide, the concentration of the slurry after high temperature stripping is higher, and can reach 3-20 wt %.

18 Claims, No Drawings

US 10,961,124 B2

METHOD FOR CONTINUOUSLY PREPARING GRAPHENE HEAT-CONDUCTING FILMS

CROSS-REFERENCE TO RELATED APPLICATIONS

The instant application is a continuation-in-part application of PCT international application No. PCT/CN2017/091791, filed on Jul. 5, 2017, which claims the benefit of the Chinese patent application No. CN201710057914.5, filed on Jan. 23, 2017, the entire disclosures of which are hereby incorporated by reference.

TECHNICAL FIELD

The present disclosure relates to graphene. In particular, the present disclosure relates to a method for continuously preparing thermally conductive graphene films.

BACKGROUND

There are major application requirements for thermal conduction and dissipation in many fields such as electronics, communications, lighting, aerospace and national defense. The mainstream thermal conductive materials in the market are still mostly aluminum or copper or their alloys. In recent years, however, thermally conductive graphene films have been widely used and quickly occupy the market share of traditional materials. Thermal-conductivity graphene film has the following advantages: high thermal conductivity in a range of from 300 w/m·k to 1500 w/m·k, which is higher than aluminum alloy and elemental copper; light weight, which is 25% lighter than aluminum and 75% lighter than copper.

At present, the methods for preparing a highly oriented thermally conductive graphene film from graphite oxide are as follows: 1. dispersing the graphite oxide in a solvent to form a graphene oxide slurry, coating on the substrate by spraying, blade coating or extrusion coating and so on, drying to form a graphene oxide film, and then chemically reducing or thermally reducing the graphene oxide film to obtain a graphene film (e.g. CN 105084858 A). In this method, the solid content of the graphene oxide slurry is very low (0.5 to 2%), so a large amount of solvent needs to be removed during the drying process, which consumes too much energy, and owing to the temperature resistance characteristic, the surface appearance of the graphene oxide film will be poor when dried above 100° C., causing the final prepared thermally conductive graphene film to be unacceptable to customers. 2. drying the graphite oxide firstly to form powders or granules, subjecting to high-temperature stripping to obtain the thin graphene sheets, dispersing the graphene sheets in a solvent to prepare a slurry, coating on a substrate by spraying, blade coating or extrusion coating and so on, drying to form a graphene film, and then thermally reducing to obtain a graphene film having a high thermal conductivity (Adv. Mater. 2014, 26(26): 4521-6). In this method, it is necessary to dry the graphite oxide firstly, which consumes too much energy and is costly.

Therefore, it is of great economic significance to develop a continuous method provided with high-efficiency and low-energy for preparing a thermally conductive graphene film.

SUMMARY

The first object of the present disclosure is to solve the problem of requiring a graphene oxide slurry with lower solid content, high energy consumption owing to remove the solvent at high temperature and the poor surface appearance of the graphene oxide film caused by high-temperature solvent removal in the process of preparing a thermally conductive graphene film in the prior art; the second is to solve the problem of tedious process, high energy consumption and high cost as a result of drying firstly and then stripping when preparing the thermally conductive graphene film and providing a method for continuously preparing the thermally conductive graphene film.

According to an aspect of the disclosure, the present disclosure provides a method for continuously preparing thermally conductive graphene films, comprising:

1) processing a graphite oxide containing 40 to 60 wt % of moisture into strips via a screw extruder, and then cutting into pellets to obtain graphite oxide particles; the graphite oxide particles has a particle size of 1 to 5 mm;

2) stripping the graphite oxide particles of step 1) at a high temperature to prepare graphene oxide powder in a high-temperature furnace protected by nitrogen or argon gas; the temperature of high-temperature stripping ranges from 800 to 1500° C.; in the process of the high-temperature stripping, the smaller the particle size in step 1), the shorter the time of the high-temperature stripping;

3) dispersing the graphene oxide powder in a solvent to form a homogeneous graphene oxide slurry by a high-speed disperser, wherein the high-speed disperser has a linear velocity of 5 to 50 m/min. The degree of homogeneity of dispersion in the present disclosure has an important influence on the thermal conductivity of the thermally conductive graphene film, and the more homogeneous, the higher the thermal conductivity will be. The thermally conductive graphene film of the present disclosure can be obtained only when the graphene oxide slurry has a viscosity of 20000-100000 mPa·s and a fineness of less than 30 μm. The high-speed disperser is provided with a cooling layer which can prevent the slurry temperature from rising and avoid affecting the dispersion effect;

4) defoaming the dispersed graphene oxide slurry of step 3) under vacuum to avoid the impact on the subsequent process. Bubbles larger than 0.2 mm are not allowed and the content of bubble less than 0.2 mm is less than 0.02 mL/L. If the bubbles do not meet the requirements, it will lead to the poor surface appearance of the resulting thermally conductive graphene film;

5) coating the defoamed graphene oxide slurry of step 4) on a substrate to form a graphene oxide film with a certain thickness by blade coating or extrusion coating, drying the graphene oxide film to remove the solvent in an oven of a coater, and then continuously winding to form coils, wherein the substrate is selected from the group consisting of a steel strip, PET, a stainless steel mesh of 500-2000 mesh and a nylon mesh of 500-1000 mesh, the thickness is 0.8-3 mm and the drying temperature of the oven of the coater is 70-150° C. In the process of removing the solvent, the graphene oxide sheet is oriented in the x-y plane due to the capillary pressure formed by the evaporation of the solvent and the thickness of the coating affects the thickness of the resulting thermally conductive graphene film.

6) stripping the graphene oxide film from the substrate of the coils of step 5) via a stripping device, and then cutting the edge of the graphene oxide film by a trimming device to form continuous coils of graphene oxide film. The stripped substrate can be repeatedly used after ultrasonic cleaning and drying, which can reduce manufacturing costs and enhance competitiveness;

7) performing heat treatment on the continuous coils of graphene oxide prepared in step 6) in a hot air oven heated from room temperature to 150° C.–500° C.;

8) placing the preliminarily reduced graphene oxide of step 7) into a high-temperature induction heating furnace heated from room temperature to 2200° C.-2800° C., which can repair and rearrange defects of graphene sheets, increase the graphitization degree, and improve the thermal conductivity of materials;

9) rolling or vacuum rolling the graphitized graphene film of step 8) to increase the density, wherein the rolling has a pressure of 10 to 30 MPa; 10) transferring and sticking the rolled graphene film of step 9) onto silicone protective films to form the resulting product.

In an aspect of the disclosure relating to the method for continuously preparing thermally conductive graphene films, the further technical solution can be that the graphene oxide powder obtained in step 2) has a sheet size of 2 to 10 μm, and a number of sheet of 1 to 8.

In an aspect of the disclosure relating to the method for continuously preparing thermally conductive graphene films, the further technical solution can be that the solvent of step 3) is selected from the group consisting of ethanol, water, NMP, DMF, furan, tetrahydrofuran or any combination thereof.

In an aspect of the disclosure relating to the method for continuously preparing thermally conductive graphene films, the further technical solution can be that the concentration of the graphene oxide in the graphene oxide slurry of step 3) is 3 to 20 wt %.

In an aspect of the disclosure relating to the method for continuously preparing thermally conductive graphene films, the further technical solution can be that the hot air oven of step 7) has a heating rate of 1-3° C./min.

In an aspect of the disclosure relating to the method for continuously preparing thermally conductive graphene films, the further technical solution can be that the high-temperature induction heating furnace of step 8) has a heating rate of 2-10° C./min.

In the present disclosure, the thermally conductive graphene film has a density of 0.015 to 2.21 g/cm$^3$; a thickness of 8 to 1000 μm; a thermal conductivity of 800 to 1900 W/m·K; a electromagnetic shielding effectiveness of 60-90 dB under the electromagnetic frequency of 30M-3 GHz; a conductivity of 5-20×10$^5$ S/m; a tensile strength of 20-80 MPa and the thermally conductive graphene film can be bent more than 300,000 times under the detection condition of R0.5/180°.

The method for continuously preparing thermally conductive graphene film in the present disclosure comprises the step of high-temperature stripping the graphite oxide containing a certain range of moisture directly, which saved the energy for drying graphite oxide. The surface functional group of graphene sheets has been mostly reduced after high-temperature stripping, so that when dispersed in a solvent, it can achieve a higher solid content in the slurry. Since most of the functional groups of the graphene sheets have been lost, the temperature of the oven can be raised to evaporate solvent quickly and increase drying efficiency when the coating is dried.

Compared with the prior art, the present disclosure has the following advantages:

1. the graphene oxide containing 40-60 wt % of moisture is directly stripping at a high temperature, thereby eliminating the process of drying graphene oxide and achieving low energy consumption and low production cost;

2. Compared with the direct dispersion of graphite oxide to prepare the slurry, the concentration of graphene oxide in the slurry prepared in the disclosure after high-temperature stripping is higher, and can reach 3-20% by weight.

Comparing to directly disperse the graphene oxide in a solvent to gain a slurry and then prepare the graphene oxide film (CN 105084858 A), the graphite oxide was stripped at a high temperature firstly and the solid content of the slurry can reach 3-20% by weight in the present disclosure. The thermal conductivity of the resulting thermally conductive graphene film can reach the level of the prior art in the case of having higher solid content in the slurry than the prior art with higher manufacturing efficiency and lower cost. In addition, higher temperatures can be adopted in the drying process, and thus the drying efficiency is higher than the prior art. According to Adv. Mater. 2014, 26(26): 4521-6, the graphite oxide is firstly dried and then stripped. By comparison, the method of the present disclosure eliminates the drying process and achieves low energy consumption and low production cost.

DETAILED DESCRIPTION OF THE EMBODIMENTS

The objective, technical solutions and advantages of the present invention will be described clearly and completely as below with reference to the embodiments. It should be understand that the description is only exemplary and is not intended to limit the scope of the invention.

The manufacturer of the graphene oxide raw material used in the present disclosure is SE2430W of Changzhou Sixth Element Materials Technology Co., Ltd. or JH005A of Nanjing Jiuhe Nano Technology Co., Ltd. The remaining reagents are commercially available conventional reagents, and the high-speed disperser is double planetary mixer equipped with a cooling layer.

Example 1

1) The graphite oxide containing 45 wt % of moisture was processed into strips via a screw extruder, and then cut into pellets to obtain graphite oxide particles having a particle size of 1 mm;

2) The graphene oxide particles of step 1) were subjected to high-temperature stripping in a high-temperature furnace protected by argon gas at the temperature of 1000° C., wherein the resulting graphene oxide powder has a sheet size of 8 μm and has a number of sheet of 6;

3) The graphene oxide powder was dispersed in ethanol to form a graphene oxide slurry by a high-speed disperser provided with a linear velocity 35 m/min. The solid content of graphene oxide slurry is 18 wt %, with the viscosity being 60450 mPa·s and the fineness being less than 30 μm;

4) The dispersed graphene oxide slurry was defoamed under a vacuum condition of 200 pa by a film defoaming machine;

5) The graphene oxide slurry was coated on a PET film via blade coating, dried in an oven of a coater, stripped and then continuously winded to form coils to obtain a thermally conductive graphene film having a thickness of 0.8 mm. The temperature distribution of the entire drying tunnel of the coater is shown in Table 1:

TABLE 1

Temperature distribution of drying tunnel of the coater

| Tunnel/section | 1 | 2 | 3 | 4 | 5 | 6 | 7 | 8 | 9 | 10 | 11 | 12 | 13 |
|---|---|---|---|---|---|---|---|---|---|---|---|---|---|
| Temperature/° C. | 85 | 90 | 95 | 100 | 110 | 120 | 130 | 120 | 110 | 100 | 95 | 85 | 80 |

6) The graphene oxide film was stripped from the substrate and then the edges of which were cut on both sides to form continuous coils of graphene oxide film;

7) The continuous coils of graphene oxide were dried in a hot air oven heated from room temperature to 300° C. with the heating rate of 1.5° C./min;

8) The resultant of step 7) was subjected in a high-temperature induction heating furnace heated from room temperature to 2700° C. with the heating rate of 3° C./min protected by argon gas;

9) The resultant of step 8) was rolled under vacuum with the rolling pressure of 30 MPa;

10) The resultant of step 9) was stuck onto silicone protective films to facilitate process.

In this example, the resulting graphene heat-conduction film has a density of 2.0 g/cm$^3$; a thickness of 40 μm; a thermal conductivity of 1300 W/m·K; a conductivity of 7×10$^5$S/m; a tensile strength of 65 MPa; and the resulting thermally conductive graphene film can be bent more than 300,000 times under the detection condition of R0.5/180°.

6) The graphene oxide film was stripped from the substrate and then the edges of which were cut on both sides to form continuous coils of graphene oxide films;

7) The continuous coils of graphene oxide were dried in the hot air oven heated from room temperature to 350° C. with the heating rate of 1.8° C./min;

8) The resultant of step 7) was subjected in the high-temperature induction heating furnace heated from room temperature to 2500° C. with the heating rate of 5° C./min protected by argon gas;

9) The resultant of step 8) was rolled under vacuum with the rolling pressure of 20 MPa;

10) The resultant of step 9) was stuck onto silicone protective films to facilitate process.

In this example, the resulting graphene heat-conduction film has a density of 1.68 g/cm$^3$; a thickness of 30 μm; a thermal conductivity of 1500 W/m·K; a conductivity of 8×10$^5$S/m; a tensile strength of 65 MPa; and the resulting thermally conductive graphene film can be bent more than 300,000 times under the detection condition of R0.5/180°.

Example 2

1) The graphite oxide containing 48 wt % of moisture was processed into strips via a screw extruder, and then cut into pellets to obtain graphite oxide particles having a particle size of 3 mm;

2) The graphene oxide particles of step 1) were subjected to high-temperature stripping in a high-temperature furnace protected by argon gas at the temperature of 1200° C., wherein the resulting graphene oxide powder has a sheet size of 7 μm and has a number of sheet of 5;

3) The graphene oxide powder was dispersed in water to form a graphene oxide slurry by a high-speed disperser provided with a linear velocity 40 m/min. The solid content of graphene oxide slurry is 10 wt %, with the viscosity being 43000 mPa·s and the fineness being less than 30 μm;

4) The dispersed graphene oxide slurry was defoamed under a vacuum condition of 100 pa by a film defoaming machine;

5) The graphene oxide slurry was coated on a 316L stainless steel mesh of 1000 mesh via blade coating, dried in an oven of a coater, stripped and then continuously winded to form coils to obtain a thermally conductive graphene film having a thickness of 1.0 mm. The temperature distribution of the entire drying tunnel of the coater is shown in Table 2:

Example 3

1) The graphite oxide containing 56 wt % of moisture was processed into strips via a screw extruder, and then cut into pellets to obtain graphite oxide particles having a particle size of 5 mm;

2) The graphene oxide particles of step 1) were subjected to high-temperature stripping in a high-temperature furnace protected by argon gas at the temperature of 1450° C., wherein the resulting graphene oxide powder has a sheet size of 6 μm and has a number of sheet of 6;

3) The graphene oxide powder was dispersed in DMF to form a graphene oxide slurry by a high-speed disperser provided with a linear velocity 30 m/min. The solid content of graphene oxide slurry is 4 wt %, with the viscosity being 35000 mPa·s and the fineness being less than 30 μm;

4) The dispersed graphene oxide slurry was defoamed under a vacuum condition of 200 pa by a film defoaming machine;

5) The graphene oxide slurry was coated on a nylon mesh of 1500 mesh via blade coating, dried in an oven of a coater, stripped and then continuously winded to form coils to obtain a grapheme oxide film having a thickness of 1.5 mm. The temperature distribution of the entire drying tunnel of the coater is shown in Table 3:

TABLE 2

Temperature distribution of drying tunnel of the coater

| Tunnel/section | 1 | 2 | 3 | 4 | 5 | 6 | 7 | 8 | 9 | 10 | 11 | 12 | 13 |
|---|---|---|---|---|---|---|---|---|---|---|---|---|---|
| Temperature/° C. | 75 | 85 | 100 | 110 | 120 | 130 | 135 | 125 | 115 | 105 | 95 | 80 | 80 |

TABLE 3

Temperature distribution of drying tunnel of the coater

| Tunnel/section | 1 | 2 | 3 | 4 | 5 | 6 | 7 | 8 | 9 | 10 | 11 | 12 | 13 |
|---|---|---|---|---|---|---|---|---|---|---|---|---|---|
| Temperature/° C. | 85 | 95 | 100 | 110 | 120 | 135 | 140 | 130 | 120 | 105 | 95 | 85 | 80 |

6) The graphene oxide film was stripped from the substrate and then the edges of which were cut on both sides to form continuous coils of graphene oxide films;

7) The continuous coils graphene oxide were dried in the hot air oven heated from room temperature to 400° C. with the heating rate of 2.5° C./min;

8) The resultant of step 7) was subjected in the high-temperature induction heating furnace heated from room temperature to 2300° C. with the heating rate of 5° C./min protected by argon gas;

9) The resultant of step 8) was rolled under vacuum with the rolling pressure of 18 MPa;

10) The resultant of step 9) was stuck onto silicone protective films to facilitate process.

In this example, the resulting graphene heat-conduction film has a density of 2.1 g/cm$^3$; a thickness of 20 μm; a thermal conductivity of 1600 W/m·K; a conductivity of 8×10$^5$S/m; a tensile strength of 60 MPa; and the resulting thermally conductive graphene film can be bent more than 300,000 times under the detection condition of R0.5/180°.

Example 4

In order to show that the thermally conductive graphene film prepared in the present disclosure can have good electromagnetic shielding performance even at a low density, a thermally conductive graphene film with low density is prepared to measure the electromagnetic shielding effectiveness.

The materials used and the steps in example 4 were identical with example 1, except for the vacuum rolling treatment of the step 9) in example 1. The density of the resultant of example 4 is 0.15 g/cm$^3$. According to the standard test method for measuring the electromagnetic shielding efficiency of planar materials of ANSI/ASTM D4935-2010, the electromagnetic shielding effectiveness (SE) of plane waves was measured in the frequency range of 30 MHz to 1500 MHz. The results are shown in the following table 4:

TABLE 4

Electromagnetic shielding effectiveness at typical frequency points

| Frequency/MHz | SE/dB |
|---|---|
| 30 | 75.5 |
| 100 | 83.9 |
| 150 | 92.6 |
| 200 | 100.9 |
| 500 | 97.9 |
| 1000 | 94.3 |
| 1100 | 89.3 |
| 1500 | 91.4 |

The shielding effectiveness of the graphene film reaches the same performance as copper and silver, but its density is only several tenths of that of copper and silver, which can greatly reduce weight for many applications.

Although the embodiments of the present disclosure have been described in detail, it is understood that various modifications and changes may be made to the embodiments of the present disclosure without departing from the spirit and scope of the invention.

We claim:

1. A method for continuously preparing thermally conductive graphene films, comprising:
    1) processing a graphite oxide containing 40 to 60 wt % of moisture into strips via a screw extruder, and then cutting into pellets to obtain graphite oxide particles;
    2) stripping the graphite oxide particles of the step 1) at a high temperature to prepare graphene oxide powder;
    3) dispersing the graphene oxide powder of the step 2) in a solvent to form a homogeneous graphene oxide slurry, wherein the graphene oxide slurry has a viscosity of 20000-100000 mPa·s and a fineness of less than 30 μm;
    4) defoaming the dispersed graphene oxide slurry of the step 3) under vacuum;
    5) coating the defoamed graphene oxide slurry of the step 4) on a substrate to form a graphene oxide film with a certain thickness, drying the graphene oxide film to remove the solvent, and then continuously winding to form coils;
    6) stripping the graphene oxide film from the substrate of the coils of the step 5) via a stripping device, and then cutting the edges of the graphene oxide film by a trimming device to form continuous coils of graphene oxide film;
    7) performing heat treatment on the continuous coils of graphene oxide prepared in the step 6) at the temperature of 150° C.-500° C., thereby realizing preliminary reduction of the graphene oxide film;
    8) subjecting the preliminarily reduced graphene oxide film of the step 7) to the temperature of 2200 to 2800° C. for graphitization to obtain a graphitized graphene film; and
    9) rolling the graphitized graphene film of the step 8) to increase the density to obtain the thermally conductive graphene films, wherein the pressure of the rolling ranges from 10 to 30 MPa.

2. The method according to claim 1, further comprising transferring and sticking the rolled graphene film of the step 9) onto the protective films to form the final product.

3. The method according to claim 1, wherein in the step 1), the graphite oxide particles have a particle size of 1 to 5 mm.

4. The method according to claim 1, wherein in the step 2), the stripping of the graphene oxide particles is completed in a high-temperature furnace, and the stripping process is protected by nitrogen or argon gas.

5. The method according to claim 1, wherein in the step 2), the temperature of the stripping ranges from 800 to 1500° C.

6. The method according to claim 1, wherein in the step 2), the graphene oxide powder has a sheet size of 2 to 10 μm, and a number of sheet of 1 to 8.

7. The method according to claim 1, wherein in the step 3), the graphene oxide powder obtained in the step 2) is dispersed in the solvent through a high-speed disperser.

8. The method according to claim 7, wherein in the step 3), the high-speed disperser has a linear velocity of 5 to 50 m/min.

9. The method according to claim 1, wherein in the step 3), the solvent is selected from the group consisting of ethanol, water, NMP, DMF, furan, tetrahydrofuran or any combination thereof.

10. The method according to claim 1, wherein in the step 3), the concentration of the graphene oxide in the graphene oxide slurry is 3 to 20 wt %.

11. The method according to claim 1, wherein in the step 4), the defoaming is completed by a defoaming machine, and in the defoamed graphene oxide slurry, there is no bubble larger than 0.2 mm and the content of bubble smaller than 0.2 mm is less than 0.02 ml/L.

12. The method according to claim 1, wherein in the step 5), the coating is performed by blade coating or extrusion coating.

13. The method according to claim 1, wherein in the step 5), the substrate has a thickness of 0.8-3 mm and is selected from the group consisting of a steel strip, PET, a stainless steel mesh of 500-2000 mesh or a nylon mesh of 500-1000 mesh.

14. The method according to claim 1, wherein in the step 5), the drying is performed in an oven of a coater and temperature of the drying is 70-150° C.

15. The method according to claim 1, wherein in the step 7), the heat treatment is performed in a hot air oven, comprising placing the continuous coils of graphene oxide prepared in the step 6) in the hot air oven heated from room temperature to 150° C.-500° C.

16. The method according to claim 15, wherein the hot air oven has a heating rate of 1-3° C./min.

17. The method according to claim 1, wherein in the step 8), the graphitization is completed in a high-temperature induction heating furnace, comprising placing the preliminarily reduced graphene oxide of the step 7) in the high-temperature induction heating furnace heated from room temperature to 2200-2800° C. for graphitization.

18. The method according to claim 17, wherein the high-temperature induction heating furnace has a heating rate of 2-10° C./min.

* * * * *